United States Patent [19]

Mansingh

[11] Patent Number: 5,020,586
[45] Date of Patent: Jun. 4, 1991

[54] AIR-COOLED HEAT EXCHANGER FOR ELECTRONIC CIRCUIT MODULES

[75] Inventor: Vivek Mansingh, Santa Clara, Calif.
[73] Assignee: Hewlett-Packard Company, Palo Alto, Calif.
[21] Appl. No.: 405,562
[22] Filed: Sep. 8, 1989
[51] Int. Cl.$^5$ .......................... F28F 3/06; H05K 7/20
[52] U.S. Cl. .................................. 165/80.3; 165/185; 361/383; 361/384
[58] Field of Search ............... 165/80.3, 185; 361/383, 361/384

[56] References Cited

U.S. PATENT DOCUMENTS

| | | | |
|---|---|---|---|
| 3,416,597 | 12/1968 | Kupferberg | 361/384 |
| 3,593,064 | 7/1971 | Wagner et al. | 361/388 |
| 4,296,455 | 10/1981 | Leycraft et al. | 165/80.3 |
| 4,369,838 | 1/1983 | Asanuma et al. | 165/185 |
| 4,682,651 | 7/1987 | Gabuzda | 165/80.3 |
| 4,768,581 | 9/1988 | Gotwald et al. | 165/80.3 |

OTHER PUBLICATIONS

Horvath, J. L., "Cooling Fin Structure", IBM Technical Disclosure Bulletin, Jul. 1980, vol. 23, No. 2, pp. 603-604.
Goldberg, IEEE Transactions on Components, Hybrids and Manufacturing Technology, vol. CHMT-7, No. 1, Mar. 1984, pp. 154-159.
Tuckerman et al, IEEE Electron Device Letters, vol. EDL-2, No. 5, May 1981, pp. 126-129.

*Primary Examiner*—Stephen M. Hepperle
*Assistant Examiner*—L. R. Leo
*Attorney, Agent, or Firm*—Roland I. Griffin; Alan H. Haggard

[57] ABSTRACT

Apparatus for cooling an electronic circuit module includes a heat sink in thermal contact with the circuit module and a device for directing cooling gas at the heat sink. The heat sink includes multiple fins defining channels between them, a base having a surface for contact with the circuit module, and a plurality of passages located between the fins and the base and interconnecting with the channels. At least a part of the cooling gas flows between the fins and absorbs thermal energy from the fins and then flows through the passages and absorbs additional thermal energy. The fins and the passages provide a large area of contact with the cooling air and reduce the pressure drop through the heat sink. The heat sink provides a path for efficient conduction of thermal energy from the circuit module to the fins and prevents the formation in the cooling air of recirculating eddies which can reduce heat transfer.

22 Claims, 2 Drawing Sheets

AIR-COOLED HEAT EXCHANGER FOR ELECTRONIC CIRCUIT MODULES

FIELD OF THE INVENTION

This invention relates to heat exchangers and, more particularly, to a high-efficiency, air-cooled heat sink that is particularly useful for cooling electronic circuit modules, but is not limited to such use.

BACKGROUND OF THE INVENTION

High-speed digital circuitry is commonly packaged in compact circuit modules which contain a number of complex integrated circuits. Such circuit modules generate large amounts of heat in a relatively small volume. Since digital circuits conduct current primarily during transitions between logic states, power requirements increase with operating speed. An additional factor that tends to increase heat dissipation in high-speed digital circuits is that the circuit components must be packaged in close proximity to each other in order to avoid the undesirable effects of long interconnecting leads. The parasitic capacitance and inductance of interconnecting leads can cause unacceptable delays when the circuit components are not carefully packaged. Therefore, high speed digital circuits are typically packaged in a compact circuit module with the spacing between components minimized. Such circuit modules may generate several hundred watts in a module having dimensions of only a few inches on a side. Efficient removal of thermal energy is necessary in order to maintain the circuit components within their rated operating temperature limits.

Prior art circuit cooling technigues have included heat sinks with air cooling, heat sinks with a recirculating liquid and cryogenic techniques. While liquid and cryogenic techniques provide highly efficient heat transfer, these techniques are complex and expensive. For example, liquid cooling requires a pump, a heat exchanger, a heat sink and interconnecting conduits. Leaks in the cooling system may damage other system components and are costly to repair. While air-cooled systems are simpler and less expensive, prior art air-cooled systems have not been adequate to handle the heat loads of high-speed digital circuit modules. Other disadvantages associated with prior art air-cooled systems include the acoustic noise associated with air flow and nonuniform cooling over the area of the circuit module.

Heat sinks commonly have multiple fins for increasing the area of heat transfer to a cooling medium. The increased heat transfer available with heat sinks having narrow channels, or microchannels, between fins is described by N. Goldberg in "Narrow Channel Forced Air Heat Sink", *IEEE Transactions On Components, Hybrids, And Manufacturing Technology*, Vol. CHMT 7, No. 1, March 1984, pp. 154–159 and by D. B. Tuckerman et al in "High Performance Heat Sinking for VLSI", *IEEE Electron Device Letters*, Vol. EDL-2, No. 5, May 1981, pp 126–129. While these designs provide improved heat transfer capability, they are inadequate for cooling high heat-dissipation circuit modules.

It is a general object of the present invention to provide apparatus for improved cooling of electronic circuit modules and other heat-generating objects.

It is another object of the present invention to provide heat sinks capable of handling large heat loads.

It is a further object of the present invention to provide heat sinks which maintain a relatively uniform temperature distribution over the area of the object being cooled.

It is yet another object of the present invention to provide air-cooled heat sinks capable of handling large heat loads.

It is a further object of the present invention to provide high capacity air cooled heat sinks wherein the generation of objectionable acoustic noise is limited.

It is a further object of the present invention to provide high capacity heat sinks which are low in cost and easy to manufacture.

It is a further object of the present invention to provide high capacity heat sinks which are easily adapted to different cooling requirements.

SUMMARY OF THE INVENTION

According to the present invention, these and other objects and advantages are achieved in apparatus for cooling an object such as a circuit module. The apparatus comprises a heat sink in thermal contact with the circuit module and means for directing a cooling gas at the heat sink. The heat sink includes multiple fins defining channels between them, a base having a surface for contact with the circuit module and a plurality of passages located between the fins and the base and interconnecting with the channels. The cooling gas is directed at the heat sink such that at least a part of the cooling gas flows between the fins and absorbs thermal energy from the fins and then flows through the passages and absorbs additional thermal energy.

In a preferred embodiment, the channels between fins are parallel to each other, and the passages are perpendicular to the channels. The heat sink includes ribs for conducting thermal energy from the base to the fins. The ribs are located between the passages. Typically, the circuit module includes plural heat-generating elements located in alignment with the ribs such that thermal energy from the heat-generating elements is efficiently conducted to the fins through the ribs. The ribs include rib portions between the fins which direct the cooling gas toward the passages. Preferably, the rib portions between the fins are tapered such that the cooling gas is directed toward the passages, and the formation of recirculating vortices, or eddies, eliminated. The heat sink is preferably fabricated as a laminated assembly of fin elements and spacer elements located between the fin elements.

In operation, cooling air is directed at the heat sink from a direction substantially perpendicular to a plane defined by the channels and the passages. A part of the cooling air flows between the fins to the passages and then changes direction and flows through the passages and is exhausted. The remainder of the air flows through the channels and is exhausted.

The heat sink of the invention takes advantage of the efficiency of narrow channel designs and provides passages interconnected with the narrow channels to further increase the area of contact with cooling air and to reduce the pressure drop through the heat sink. The heat sink of the invention also provides a path for efficient conduction of thermal energy from the circuit module to the fins and prevents the formation in the cooling air of recirculating eddies which reduce thermal transfer. As a result, the heat sink can handle a large heat load and provides a relatively uniform temperature distribution over its surface area.

BRIEF DESCRIPTION OF THE DRAWINGS

For a better understanding of the present invention, together with other and further objects, advantages and capabilities thereof, reference is made to the accompanying drawings which are incorporated herein by reference and in which.

DETAILED DESCRIPTION OF THE INVENTION

Figure 1:
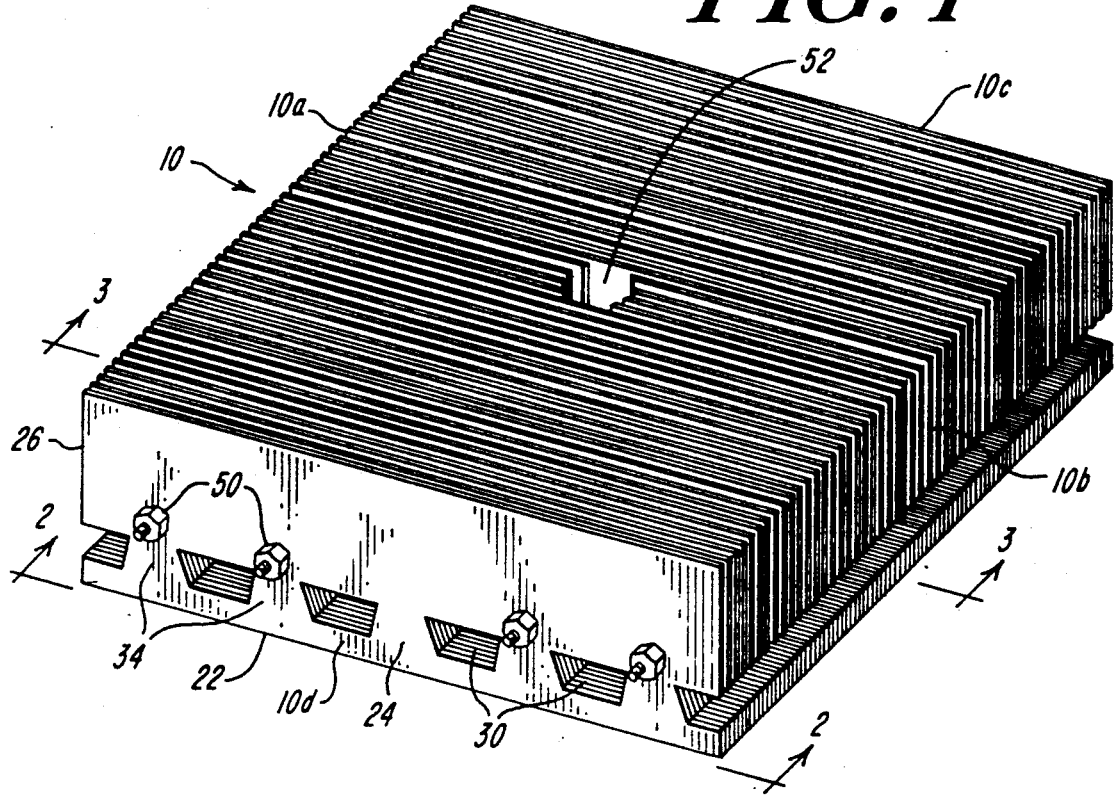
FIG. 1 is a perspective view of a heat sink in accordance with the present invention.

A preferred embodiment of a heat sink 10 in accordance with the present invention is shown in FIGS. 1–5. The heat sink 10 is a thermally-conductive unit which is mounted in thermal contact with an object to be cooled, typically an electronic circuit module 14. The circuit module 14 is an assembly that includes a number of closely spaced heat generating elements such as integrated circuits 16. Cooling air, represented by arrows 18, is directed at heat sink 10. The cooling air 18 can be from a fan or a plenum (not shown). Preferably, the flow of cooling air 18 is uniformly distributed over the area of heat sink 10. Thermal energy is conductively transferred from circuit module 14 to heat sink 10 and then is transferred from heat sink 10 to cooling air 18.

The heat sink 10 includes a base 24 having a surface 22 which contacts the circuit module 14, and multiple cooling fins 26. The cooling fins 26 are typically in the form of parallel metal plates which define parallel channels 28 between them. The heat sink 10 further includes a plurality of parallel passages 30 located between fins 26 and base 24. The passages 30 are interconnected with channels 28 so as to permit air flow from channels 28 to passages 30. Channels 28 extend across a first dimension of heat sink 10 and terminate at opposite side edges 10a and 10b, while passages 30 extend across a second dimension of heat sink 10 perpendicular to the first dimension and terminate at opposite side edges 10c and 10d.

The base 24 of heat sink 10 is thermally connected to fins 26 by ribs 34 located between passages 30. The ribs 34 include rib portions 34a between base 24 and fins 26. Ribs 34 also include rib portions 34b located between fins 26 in channels 28. Rib portions 34b have a generally triangular, or tapered, shape with apexes 36 oriented toward the direction of flow of cooling air 18.

The triangular configuration of rib portions 34b provides two important functions. The triangular shape directs cooling air 18 toward passages 30, while avoiding the formation of recirculating eddies in the air flow through channels 28. Such eddies lower the rate of heat transfer from heat sink 10 to the cooling air 18. In addition, the rib portions 34b efficiently conduct thermal energy from base 24 to fins 26. The heat sink 10 can be designed so that ribs 34 are aligned with integrated circuits 16. With this arrangement, thermal energy is efficiently conducted from integrated circuits 16 through ribs 34 to fins 26.

Figure 4:
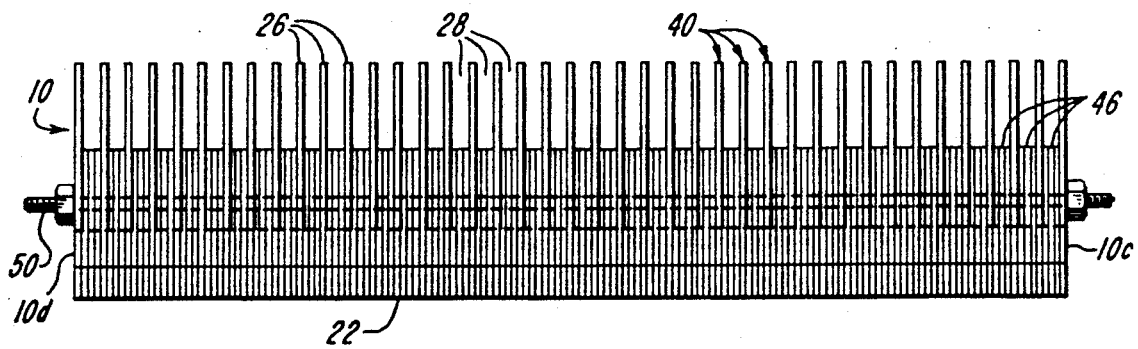
FIG. 4 is an end view of the heat sink.
Figure 5:
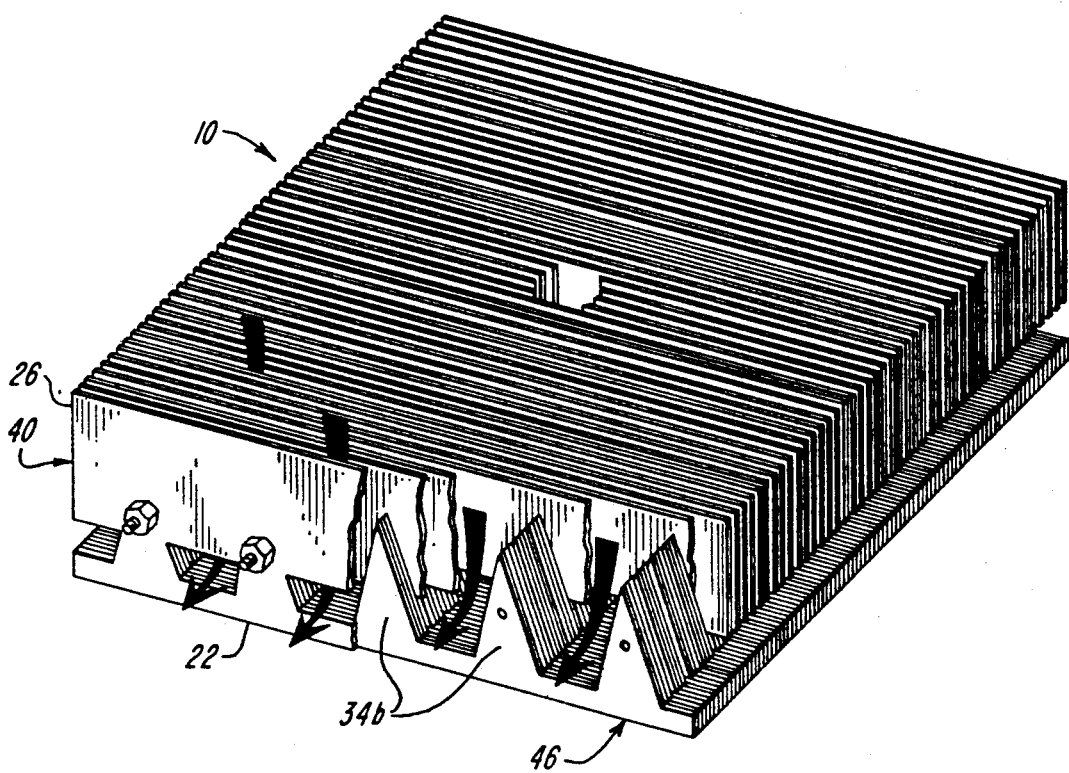
FIG. 5 is a partially broken-away, perspective view showing the direction of air flow through the heat sink.

From FIGS. 1 and 4, it can be seen that fins 26 form a series of parallel plates defining channels 28 between them. The long dimensions of channels 28 are preferably perpendicular to passages 30. In operation, cooling air 18 is directed at the heat sink 10 in a direction substantially perpendicular to passages 30. The cooling air 18 impinges on the tops of fins 26, passes downward through channels 28 and absorbs heat from fins 26. A portion of the cooling air passes directly to passages 30 where it changes direction by 90° and flows through passages 30. Cooling air 18 that impinges on the heat sink 10 between passages 30 is directed toward passages 30 by triangular rib portions 34b. As indicated above, the rib portions 34b as well as the passages 30 prevent formation of recirculating eddies which can reduce the rate of heat transfer from heat sink 10 to cooling air 18. The cooling air absorbs additional heat as it flows through passages 30 and is exhausted from the ends of passages 30. A second portion of the cooling air 18 flows laterally through channels 28 without entering passages 30, absorbs heat from fins 26 and is exhausted from the ends of channels 28.

In summary, cooling air 18 flows both through passages 30 and through channels 28, thereby increasing the area of contact between the heat sink 10 and cooling air 18 and increasing the rate of heat transfer in comparison with prior art heat sinks. Furthermore, the distance traveled by the cooling air between the point of impingement on the heat sink 10 and the the point of exhaust is relatively short. As a result, the temperature distribution over the surface 22 is relatively uniform, and hot spots are avoided.

Figure 2:
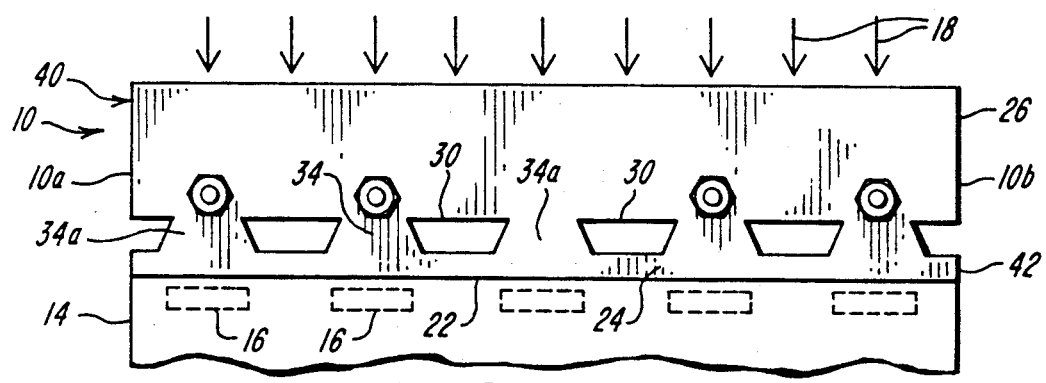
FIG. 2 is an elevation view of the heat sink taken along the line 2—2 of FIG. 1.
Figure 3:
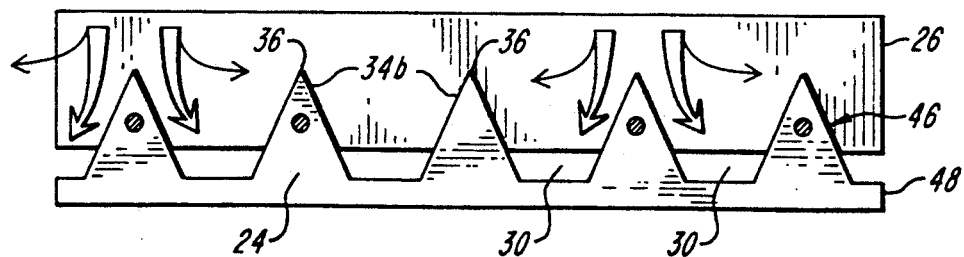
FIG. 3 is a cross-sectional view of the heat sink taken along the line 3—3 of FIG. 1.

The heat sink 10 typically has a generally square or rectangular shape, but is not limited to such a shape. In a preferred embodiment, the heat sink 10 has a laminated construction of metallic sheets that are fabricated with two different geometries. A fin element 40, as best shown in FIG. 2, includes a base strip 42 and a fin 26 interconnected by rib portion 34a. Openings in fin element 40 between rib portions 34a correspond to passages 30. A spacer element 46, as best shown in FIG. 3, includes a base strip 48 and triangular rib portions 34b projecting from base strip 48. When the fin elements 40 and the spacer elements 46 are placed together, rib portions 34a and 34b align with each other to form continuous ribs 34 between passages 30. The fin elements 40 and the spacer elements 46 are fabricated by chemically milling or stamping thin copper or aluminum sheets. The fin elements 40 and the spacer elements 46 are assembled in an alternating configuration and are attached together by bolts 50 which pass through all of the elements and/or by soldering. The heat sink 10 can optionally be provided with one or more holes 52 for mounting to the circuit module 14. After assembly of fin elements 40 and spacer elements 46, the surface 22 can be machined to a smooth surface for attachment to circuit module 14.

The parameters of the heat sink 10 can be varied by varying the number and positions of the fin elements 40 and the spacer elements 46 used in the assembly. The fin thickness can be increased by placing two or more fin elements 40 together. Similarly, the channel width can be increased by placing two or more spacer elements 46 together.

An important feature of the invention is the provision of an efficient heat conduction path between the circuit module 14 and the fins 26. The triangular rib portions 34b of spacer elements 46 and the rib portions 34a of fin elements 40 are preferably positioned directly opposite the integrated circuits 16 in the circuit module 14. As a result, short and efficient thermally-conductive paths are provided between integrated circuit 16 and fins 26. From FIG. 4, it can be seen that thermal energy is conducted directly upward from surface 22 through fin elements 40 to fins 26. In addition, thermal energy is conducted from surface 22 upwardly through spacer elements 46 and then laterally to fins 26.

Another important feature of the invention is that cooling air 18 enters the heat sink 10 vertically, flows over fins 26 and then takes a 90° turn to exit through passages 30 located under fins 26. Some of the cooling air 18 also flows through channels 28 between fins 26. Thus, the disclosed heat sink increases heat exchange and provides increased available surface area for convection heat transfer to air in comparison with prior art heat sinks. The cooling air that flows through channels 28 and into the passages 30 prevents formation of recirculating eddies which can lower the convective heat transfer to the cooling air. Since a significant portion of the cooling air flows through passages 30, the effective length of fins 26 over which cooling air flows is very short, thereby keeping the caloric thermal resistance, or thermal resistance due to heating of air, very low.

It will be understood that the parameters of the heat sink 10 in accordance with the present invention can be varied in order to meet the requirements of different cooling applications. For example, the thickness and spacing of the fins 26 can be altered as necessary. An increase in the number of fins 26 lowers the convective thermal resistance, or rate of heat transfer from the fins to the cooling air. However, for a given pressure drop, the flow rate decreases as the number of fins increases, thereby increasing the caloric thermal resistance. Conversely, when the number of fins 26 is reduced, the convective thermal resistance is increased, but for a given pressure drop, the flow rate increases and thereby decreases the caloric thermal resistance. The geometry and width of the fin elements and spacer elements, including the height, can be optimized for maximum fin efficiency and maximum heat transfer with a desired air pressure drop. The width of the channels 28 can be changed by adding or removing spacer elements 46. The addition or removal of spacer elements 46 changes the thermal resistance and the pressure drop characteristics of the heat sink. A particular channel width can be chosen for any specific cooling requirement based on available air pressure drop.

In an example of the heat sink described herein, the outside dimensions were 110 mm×110 mm×26 mm. The fins 26 had a height of 18 mm, and a thickness of 0.52 mm. The heat sink had a total of 49 fin elements and 48 spacer elements soldered together to give the required overall dimensions. The channels 28 had a width of 1.04 mm. The passages 30 had a trapezoidal shape with dimensions of base one=13.69 mm, base two=10.00 mm and height=4.00 mm. In tests at about 600 watts of power, the heat sink had a thermal resistance of 0.06° C. per watt with about 1.4 inches of water pressure drop and 180 cubic feet per minute of air flow. When tested with a small 6 inch tube axial muffin fan, the thermal resistance was found to be about 0.12° C. per watt at 0.4 inch of water pressure drop and 85 cubic feet per minute air flow. It is believed that this air cooled heat sink performance can only be matched by state of the art liquid cooled heat exchangers.

While there have been shown and described what are at present considered the preferred embodiments of the present invention, it will be obvious to those skilled in the art that various changes and modifications may be made therein without departing from the scope of the invention as defined by the appended claims.

What is claimed is:

1. Apparatus for cooling an object, comprising:
   a heat sink having a surface for thermal contact with said object, said heat sink including multiple fins defining channels between them and means defining a plurality of passages located between said fins and said surface, said passages interconnecting with said channels, said heat sink further including ribs between said fins; and
   means for directing a cooling gas at said heat sink such that said cooling gas flows at least in part through said channels into said passages, said ribs directing said cooling gas toward said passages.

2. Cooling apparatus as defined in claim 1 wherein said channels are parallel to each other and said passages are perpendicular to said channels.

3. Cooling apparatus as defined in claim 2 said surface is planar and wherein said cooling gas is directed at said heat sink in a direction generally perpendicular to surface.

4. Cooling apparatus as defined in claim 3 wherein said heat sink is generally rectangular in shape, wherein said channels terminate at a first pair of opposite side edges thereof and wherein said passages terminate at a second pair of opposite side edges thereof.

5. Cooling apparatus as defined in claim 1 wherein said ribs are generally triangular in shape.

6. Apparatus for cooling an object, comprising:
   a heat sink having a surface for thermal contact with said object, said heat sink including multiple fins defining channels between them and means defining a plurality of passages located between said fins and said surface, said passages interconnecting with said channels, said heat sink comprising fin elements separated by spacer elements in a laminated construction, said passages extending through said fin elements, said spacer elements each including a base portion and rib portions projecting from said base portion; and
   means for directing a cooling gas at said heat sink such that said cooling gas flows at least in part through said channels into said passages.

7. Cooling apparatus as defined in claim 6 wherein said fin elements each include a fin portion and a base portion separated by rib portions.

8. Cooling apparatus as defined in claim 6 wherein said rib portions extend between said fins and conduct thermal energy from said base to said fins.

9. Cooling apparatus as defined in claim 6 wherein said rib portions are generally triangular in shape.

10. Apparatus for cooling a circuit module, comprising:
    a heat sink including multiple fins defining channels between them, a base having a surface for thermal contact with said circuit module and a plurality of ribs interconnecting said base and said fins, said ribs defining between them a plurality of passages interconnecting with said channels, said heat sink being fabricated as a laminated assembly of fin elements and spacer elements each comprising metal sheets; and
    means for directing a cooling gas at said heat sink in a direction generally perpendicular to said passages such that said cooling gas flows at least in part through said channels into said passages and through said passages.

11. Apparatus for cooling a circuit module, comprising:
- a heat sink for thermal contact with said circuit module, said heat sink including multiple fins defining channels between them, a base having a surface for thermal contact with said circuit module, a plurality of passages located between said fins and said base and interconnecting with said channels, and ribs located between said fins; and
- means for directing a cooling gas at said heat sink such that at least a part of said cooling gas flows between said fins and absorbs thermal energy from said fins and then flows into and through said passages, said ribs directing said cooling gas toward said passages.

12. Cooling apparatus as defined in claim 11 wherein said channels are parallel to each other and said passages are perpendicular to a long dimension of said channels.

13. Cooling apparatus as defined in claim 12 wherein said ribs conduct thermal energy from said base to said fins.

14. Cooling apparatus as defined in claim 12 wherein said cooling gas is directed at said heat sink in a direction generally perpendicular to said passages.

15. Cooling apparatus as defined in claim 11 wherein said ribs are generally triangular in shape.

16. Cooling apparatus as defined in claim 11 wherein said ribs between said fins are tapered so as to direct said cooling gas toward said passages.

17. Cooling apparatus as defined in claim 11 wherein said cooling gas comprises air.

18. Cooling apparatus as defined in claim 11 wherein said circuit module includes plural heat-generating elements and wherein said heat-generating elements are located in alignment with said ribs such that thermal energy from said heat-generating elements is efficiently conducted through said ribs to said fins.

19. Cooling apparatus as defined in claim 11 wherein another part of said cooling gas flows through said channels without entering said passages and adsorbs thermal energy from said fins.

20. Cooling apparatus as defined in claim 14 wherein said heat sink is generally rectangular in shape, wherein said channels terminate at a first pair of opposite side edges thereof and wherein said passages terminate at a second pair of opposite side edges thereof.

21. Apparatus for cooling a circuit module, comprising:
- a heat sink including multiple fins defining channels between them, a base having a surface for thermal contact with said circuit module and a plurality of ribs interconnecting said base and said fins, said ribs defining between them a plurality of passages interconnecting with said channels, said ribs including rib portions between said fins; and
- means for directing a cooling gas at said heat sink in a direction generally perpendicular to said passages such that said cooling gas flows at least in part through said channels into said passages and through said passages, said rib portions directing said cooling gas toward said passages.

22. Apparatus for cooling a circuit module, comprising:
- a heat sink for thermal contact with said circuit module, said heat sink including multiple fins defining channels between them, a base having a surface for thermal contact with said circuit module and a plurality of passages located between said fins and said base and interconnecting with said channels, said heat sink being fabricated as a laminated assembly of fin elements and spacer elements between said fin elements, said passages extending through said fin elements; and
- means for directing a cooling gas at said heat sink such that at least a part of said cooling gas flows between said fins and absorbs thermal energy from said fins and then flows into and through said passages.

* * * * *